United States Patent [19]

Suzuki

[11] Patent Number: 4,982,227

[45] Date of Patent: Jan. 1, 1991

[54] PHOTOLITHOGRAPHIC EXPOSURE APPARATUS WITH MULTIPLE ALIGNMENT MODES

[75] Inventor: Kazuaki Suzuki, Tokyo, Japan

[73] Assignee: Nikon Corporation, Tokyo, Japan

[21] Appl. No.: 318,908

[22] Filed: Mar. 3, 1989

[30] Foreign Application Priority Data

Mar. 8, 1988 [JP] Japan .................................. 63-54328

[51] Int. Cl.$^5$ ............................................ G03B 27/42
[52] U.S. Cl. ...................................... 355/53; 355/46; 355/54
[58] Field of Search ......................... 355/53, 54, 77, 46

[56] References Cited

U.S. PATENT DOCUMENTS

| | | | |
|---|---|---|---|
| 4,385,838 | 5/1983 | Nakazawa et al. | 356/399 |
| 4,659,226 | 4/1987 | Elabd | 355/53 |
| 4,748,478 | 5/1988 | Suwa et al. | 355/53 |
| 4,780,617 | 10/1988 | Umatate et al. | 250/548 |

Primary Examiner—L. T. Hix
Assistant Examiner—Cassandra C. Spyrou
Attorney, Agent, or Firm—Shapiro and Shapiro

[57] ABSTRACT

An exposure apparatus in an exposure operation involving image composing or photocomposing, adapts an alignment method for defining the actual positions of all the shot areas on a wafer by sample alignment prior to the exposure operation. It is assumed that a substrate, such as a wafer, is provided with regularly positioned plural image transfer areas each of which is divided into at least two partial areas, and the apparatus executes superimposed exposures with different of the same patterns respectively by a step-and-repeat or step-and-scan-method.

8 Claims, 7 Drawing Sheets

PHOTOLITHOGRAPHIC EXPOSURE APPARATUS WITH MULTIPLE ALIGNMENT MODES

BACKGROUND OF THE INVENTION

1. Field of the Invention

The present invention relates to a method of exposure in photolithography for use in the manufacturing process of semiconductor devices, and more particularly to an exposure method with so-called image composing (or photocomposing) in which the circuit pattern area to be formed on a semiconductor wafer is divided into plural partial areas and super-imposed exposures are made with partial circuit patterns respectively corresponding to said partial areas.

2. Related Background Art

In recent photolithographic processes reduction (or equal-size) projection exposure apparatus has been widely used for exposing a wafer to the pattern of a reticle. Such apparatus is used for exposing the wafer, coated with photoresist, to the pattern of the reticle through a projection lens. Since the area covered by an exposure is smaller then the total area of the wafer, there is usually employed a step-and-repeat method in which the exposure is repeated in combination with the stepping of the wafer by a predetermined pitch.

In such apparatus, the minimum resolvable line width is determined by the wavelength of the illuminating light for exposure, the numerical aperture (N. A.) of the projection lens etc. The resolving power is improved as the wavelength of the illuminating light becomes shorter or as the numerical aperture increases, but these factors have limits in practice. An approach, therefore, for improving the resolving power is to increase the reduction projection rate, by reducing the area of projection exposure. This approach is used because of the difficulty in designing and manufacture of a projection lens with a large, numerical aperture, combined with a large projection area.

For example, in case a resolving power of 1 μm is achieved over a projection area of 10×10 mm in 1/10 reduction projection with a projection lens of numerical aperture of 0.35, it is extremely difficult to re-design and manufacture said lens to achieve a higher resolving power by increasing the numerical aperture only. However, it is relatively easy to increase the numerical aperture if the projection area is reduced for example to 5×5 mm (corresponding to an image field of ca. 7.1 mmφ). In such case even a numerical aperture of 0.5 is achievable, and such projection lens can stably achieve a sub-micron resolving power over the entire projection area (5×5 mm). Experimentally there has been obtained a resolving power easily down to 0.8 μm over the entire area, and even of 0.6 μm under best conditions, with the conventional illuminating wavelength of g-line (436 nm). Such stable achievement of sub-micron resolving power could not be anticipated when reduction projection exposure apparatus, or so-called steppers, were introduced into commercial production.

A projection lens, of such high resolving power will result in limitation of the size of the circuit pattern (corresponding to a chip) to be formed on the wafer, due to the reduced projection area. In order to avoid such limitation there has been considered a method called image composing or photocomposing.

The exposures with such image composing or photocomposing method are essentially the same as those in the conventional step-and-repeat method, but the image alignment between the pattern in an area and the pattern in a neighboring area has to be extremely strictly controlled in the X and Y directions, because any joint error will result in defects, such as broken wirings, in all the jointing portions so that it is almost impossible to rescue the chip area.

It is therefore necessary to maintain not only the matching accuracy of the layers of finer patterns but also the two-dimensional joint accuracy in the chip area. The maintaining of such matching accuracy and joint accuracy corresponds to three-dimensional alignment in the semiconductor chip to be formed on the wafer, and is extremely difficult to achieve in consideration of the deformation of the wafer in the process and the errors in the units of the stepper (fluctuations in the alignment accuracies and fluctuation in the running characteristic of the wafer stage).

A possible solution to this problem is to align each of the exposure areas on the wafer with the reticle to be subjected to superimposed exposure, by means of an alignment sensor, immediately before each exposure. Although this method can ensure satisfactory alignment, it is associated with a low throughput, as the aligning operation is required for each exposure (each shot) on each area of the wafer.

It is therefore expected, also in the exposure sequence with image composing, to adopt the enhanced wafer global alignment (E. G. A.) method for achieving accurate alignment between the reticle pattern and each exposure area on the wafer, as disclosed in U.S. Pat. No. 4,780,617. In this E. G. A. method, prior to the exposure operation of a wafer, a sample alignment is conducted by measuring the position of marks attached to plural shot areas on the wafer, thereby statistically determining six parameters of the offset (x, y) of the center of the wafer, elongation or contraction (x, y) of the wafer, remaining rotation of the wafer and perpendicularity of the wafer stage (or of arrangement of the shot areas), based on the difference between the design positions and the measured positions of the marks. The stepping of the wafer is conducted with correction of the positions of a second shot to be superimposed, based on the design positions and thus determined parameters. This method is advantageous in improving the throughput because detection and measurement of the marks are no longer necessary, after the measurement of a relatively limited number of marks (marks of 3 to 16 shots) in comparison with the total number of shots on the wafer, and in achieving an alignment accuracy, for all the shot areas, equivalent to or better than that in the alignment method for each shot (die-by-die or site-by-site alignment), since the detection error for each mark is statistically averaged by the sample alignment of a sufficient number of marks.

The introduction of such E. G. A. method in the exposure sequence for a 2nd layer involving image composing realizes optimum alignment of the first reticle (pattern A'), second reticle (pattern B'), third reticle (pattern C') and fourth reticle (pattern D') respectively with areas A, B, C and D in each chip area, but this is not necessarily the best aligning method in consideration of the jointing accuracy among the areas A, B, C and D.

SUMMARY OF THE INVENTION

An object of the present invention is to provide an exposure apparatus, in an exposure operation involving image composing (or photocomposing) as explained above, adopting an alignment method for defining the actual positions of all the shot areas on the wafer by sample alignment prior to the exposure operation. In the present invention, it is assumed that a substrate, such as a wafer, is provided with regularly positioned plural image transfer areas each of which is divided into at least two partial areas, such as a first partial area (A) and a second partial area (B), and the apparatus executes superimposed exposures with different (or same) patterns respectively for said partial areas (A) and (B) by a step-and-repeat or step-and-scan-method.

According to the present invention, there is provided position detection means for detecting an alignment mark formed in the first partial area (A) or that formed in the second partial area (B), thereby determining the relative position of the partial area (A) or (B) with respect to the mark (or reticle). In the embodiments of the present invention, said position include several alignment systems together with an alignment data input unit.

Such alignment systems only detect alignment marks, but such detection of mark position corresponds to the determination of relative position of a partial area (A or B) on the wafer.

Also according to the present invention there is provided mode input means for selecting one out of three input alignment modes in the sample alignment of the divided areas (A), (B) on the wafer. Said modes include a first alignment mode in which said position detection means determines plural positions only on the first partial areas (A), a second alignment mode in which said means determines plural positions only on the second partial areas (B), and a third alignment mode in which at least one position is determined for each of the first partial areas (A) and the second partial areas (B). There is further provided control means for stepping the wafer, according to the arrangement of the shots (first or second partial areas) determined according to the selected one of the above-mentioned alignment modes.

The present invention explained above is schematically illustrated in a block diagram shown in FIG. 1. A wafer W is provided, as an example, with six chip areas $DC_1$-$DC_6$, each of which is divided into two partial areas A, B. Each area may be divided into a larger number of partial areas. The position detection means functions in one of three alignment modes. In the first mode, the mark position is measured only in the areas A ($DC_n(A)$) contained in n areas (preferably at least three) among the chip areas $DC_1$-$DC_6$. In the second mode, the mark position is measured only in the areas B ($DC_n(B)$) contained in n areas among the chip areas $DC_1$-$DC_6$. In the third mode, the mark position is measured in m (at least 1) areas A and m' (at least 1) areas B. In said third mode, the matching accuracy and the jointing accuracy can be maximized at the same time by selecting the numbers m, m' so as to satisfy $m+m' \geq n$ and $m \geq m'$, wherein n ($\geq 3$) is the designated number of input position information obtained by mark measurements.

Although three alignment modes have been explained in the foregoing, there may be employed only two modes, namely the first or second mode and the third mode, depending on the kind of device to be manufactured by the superimposed exposures or on the number of partial areas in the chip area.

Therefore, said modes can be divided into a mode in which the sample alignment is conducted on the same partial areas in some of the plural chip areas, and another mode in which the sample alignment is conducted on different partial areas of some of the plural chip areas.

According to the present invention, in dividing each chip area DC on the wafer into plural (two or more) partial areas and effecting superimposed exposures with different reticle patterns for said partial areas, there can be arbitrarily selected an operation of obtaining a best matching accuracy in each of the partial areas in each chip area, or an operation of obtaining a best jointing accuracy for the patterns corresponding to the partial areas in each chip area, or an operation of suitably balancing said matching accuracy and the jointing accuracy.

For example, in case of forming a layer requiring a strict jointing accuracy on the wafer, in the exposure of a new pattern for a partial area, the measurement with the E. G. A. method is conducted on the alignment marks of the same partial areas of the chip areas. Thus, in case of exposures with the replacement of reticles while a wafer is placed on the stage (mode 1 in the exposure sequence), the alignment for all the partial areas in a chip area can be completed by a single mark measurement (sample alignment) immediately after the wafer is loaded on the stage, and, among the parameters defined in the E. G. A. method, the jointing accuracy is influenced only by the wafer elongation or contraction (Rx, Ry) wafer rotation ($\theta$) and perpendicularity (w). Naturally the alignment error of the reticle at the replacement thereof influences the jointing accuracy, but said error can be made sufficiently small and can therefore be negligible in the overall accuracy. On the other hand, the case of exposures by exchanging wafers for the same reticle (mode 2 in exposure sequence) provides an improved throughput, and avoids the loss of jointing accuracy resulting from the measurements of different alignment marks, since the same alignment marks on the wafer are commonly measured for different reticles. In the mode 1 or 2 of the above-explained exposure sequence, it is possible to avoid the influence of offset of the arrangement of the partial areas and to expect the accuracy of image composing by selecting the marks to be measured, from common partial areas in the chip areas on the wafer.

On the other hand, it is possible to improve both the matching accuracy and the jointing accuracy by selecting the marks to be measured from all the partial areas with a suitable percentage.

Also in case of a strict requirement for matching accuracy, the E. G. A. method is executed by measuring the marks selected from the partial areas where the superimposed exposures are conducted, either in the mode 1 or 2 of the exposure sequence, so that the accuracy of superimposing is not affected though the throughput is lowered.

DESCRIPTION OF THE PREFERRED EMBODIMENTS

Figure 1:
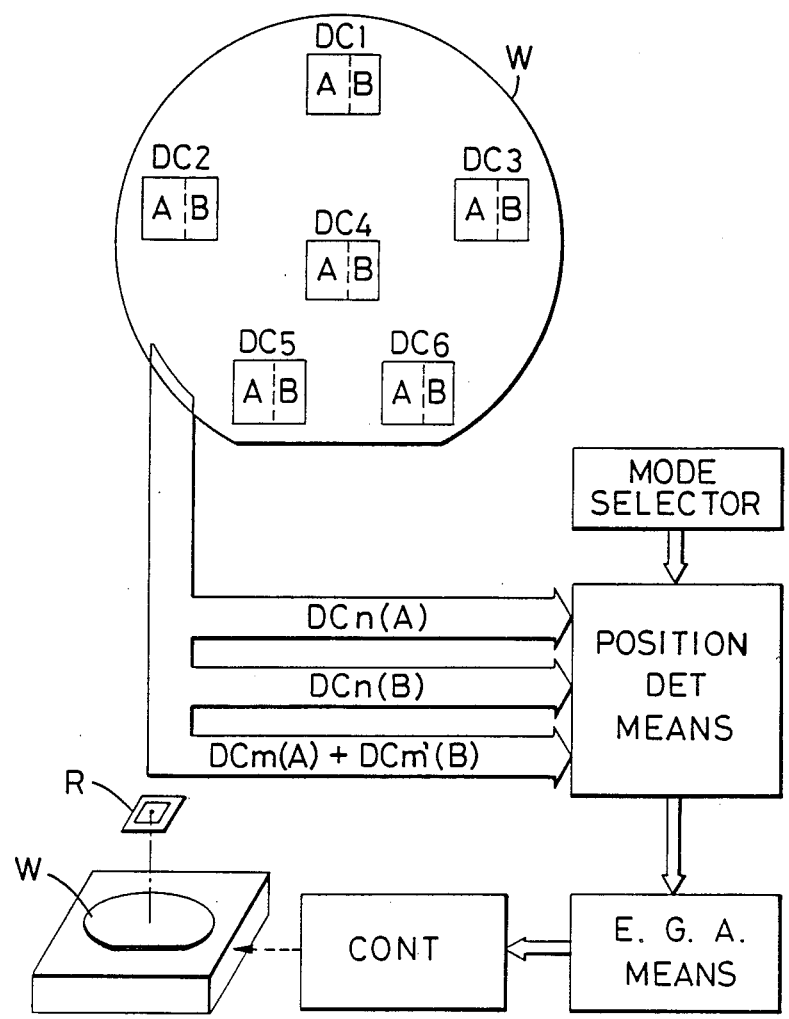
FIG. 1 is a schematic view showing the structure of the present invention.
Figure 2:
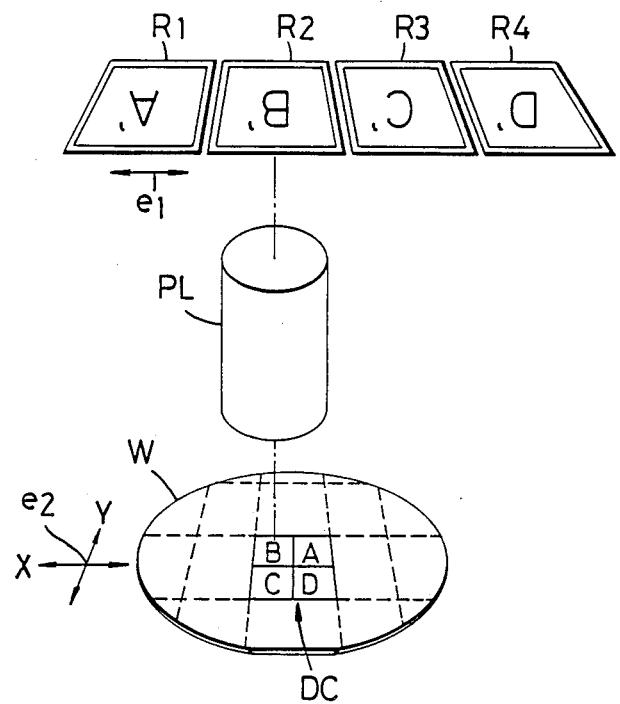
FIG. 2 is a schematic view showing the principle of image composing.
Figure 3:
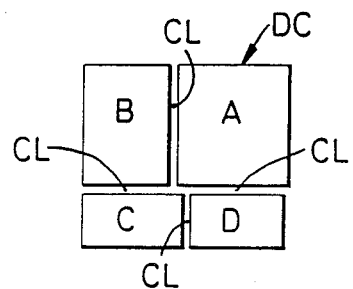
FIG. 3 is a plan view of a chip area.

FIG. 2 shows an example of exposure with image composing, in which are employed four reticles $R_1$, $R_2$, $R_3$, $R_4$ respectively bearing circuit pattern portions A', B', C', D'. On the wafer W to be exposed, circuit patterns areas (chip areas) DC to be cut out as chips are formed as a matrix, defined by scribe lines. Each chip area DC is divided, as shown in FIG. 3, into partial areas A, B, C, D respectively corresponding to the pattern areas A', B', C', D' of the reticles $R_1$-$R_4$. The areas A, B, C, D in the chip area DC are so patterned that they are mutually connected electrically with jointing portions CL. Said jointing portions CL are formed, for example, with aluminum wirings.

As shown in FIG. 2, the pattern area B' of the reticle $R_2$, for example, is set in a predetermined position in the viewing field of a projection lens PL, and the areas B in the chip areas DC are successively aligned with and exposed to the pattern B' of the reticle $R_2$, by moving the wafer W in the x, y directions as indicated by arrows $e_2$ in a step-and-repeat method. After the exposure of the pattern B' is composed over the entire surface of the wafer W, the reticle $R_2$ is replaced, as indicated by an arrow $e_2$, by the reticle $R_3$ with the pattern C'. Then the areas C of the chip areas DC on the wafer W are successively aligned with and exposed to the pattern C' of the reticle $R_3$ in a similar step-and-repeat process. Thereafter the exposures are conducted for the reticle $R_1$ (pattern A') and the reticle $R_4$ (pattern D') to complete the exposure process for a wafer.

Figure 4:
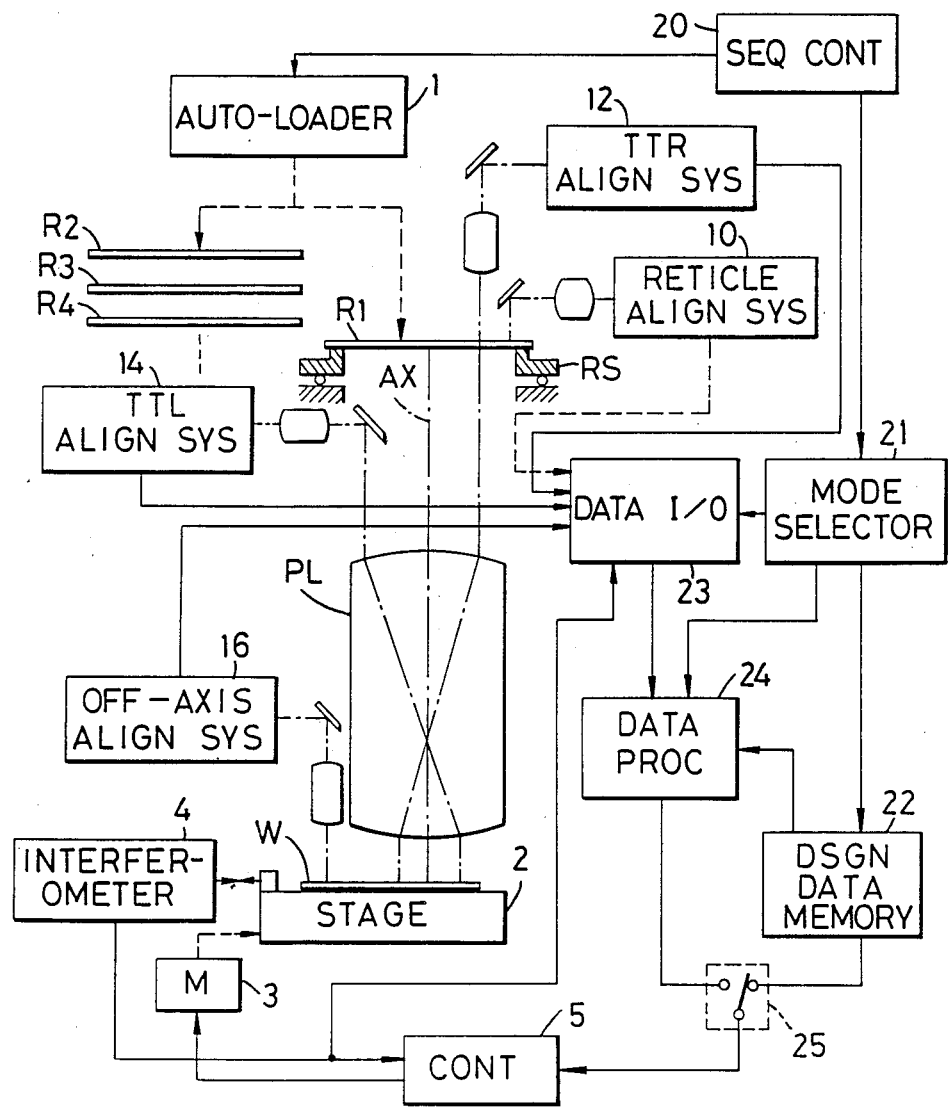
FIG. 4 is a block diagram of an embodiment of the present invention.

Now reference is made to FIG. 4 for explaining the schematic structure of the projection exposure apparatus embodying the present invention.

A reticle $R_1$ is vacuum sucked to a reticle stage RS of the exposure apparatus, while other reticles $R_2$-$R_4$ are housed in a reticle reservoir (hereinafter called library). The replacement of the reticle is automatically carried out by an automatic loader 1. The reticle stage RS is capable of two-dimensionally moving finely in the horizontal plane while supporting the reticle, and is used for positioning the reticle with respect to a reference position of the apparatus, for example the optical axis AX of the projection lens PL.

Below the projection lens PL there is provided a wafer stage 2 for supporting a wafer W and moving the same two-dimensionally by a motor 3. Said wafer stage 2 is used for fine movements for the alignment to be explained later, and for the step-and-repeat movements for the exposures. On an end of the stage 2 there is provided a movable mirror for perpendicularly reflecting the light from a laser interferometer 4 for measuring the position of the stage 2. Though only one set of motor 3 and interferometer 4 is illustrated, another set is provided for the movement in another direction. The movement of the stage 2 is controlled by a stage controller 5, which appropriately drives the motors 3 based on information on the measured position from the interferometer and information on the target position.

The apparatus of the present embodiment is provided with four alignment systems; which are a reticle alignment system 10 for aligning the reticle only with respect to the apparatus; a TTR alignment system 12 for direct alignment of the reticle and the wafer W by simultaneously detecting a reticle mark and a mark attached to the exposure area on the wafer; a TTL wafer alignment system 14 for aligning the wafer W with respect to the apparatus, particularly to the optical axis AX by detecting a mark on the wafer W through the projection lens PL but not through the reticle; and an off-axis wafer alignment system 16 for aligning the wafer with respect to the apparatus by detecting a mark on the wafer W independently from the projection lens PL. Among these four systems, the present embodiment particularly utilizes the wafer alignment systems 12, 14 and 16.

A sequence controller 20 sends an instruction for reticle replacement to the automatic loader 1 for setting a desired reticle on the apparatus, and also sends an instruction to a mode selector 21 for designating the partial area to be exposed. In response the mode selector 21 selects one of plural predetermined alignment modes, and provides an instruction for recalling, from a memory 22, data indicating the design positions of the alignment marks required in the selected alignment mode. The mode selector 21 also sends an instruction, to a data input/output unit 23, as to which alignment system (wafer alignment system 14 or 16) is to be used for obtaining the information on the mark position (alignment data). The data input/output unit 23 provides alignment data based on the mark information from the selected alignment system and the position information of the wafer from the interferometer 4. Based on the alignment data provided by the data input/output unit 23 and the design data from the memory 22, a data processing unit 24 determines the position of the wafer stage 2 or the shot position of the wafer in such a manner that the partial area to be exposed of the wafer is aligned with the projected pattern of the reticle.

The principle of calculation of said exposure position is the same as that disclosed in the aforementioned U.S. Pat. No. 4,780,617. The data processing unit 24 also refers, if necessary, to design values of the shot arrangement mark of all the divided areas on the wafer, which are also stored in said data processing unit 24.

The sequence of alignment (alignment for determining the exposure positions and algorithm therefor) is determined according to the instruction from the mode selector 21. In the present embodiment the mode selector has three alignment modes, one of which is selected by the operator.

A selector switch 25 sends either the design data from the memory 22 or the exposure position information from the data processing unit 24, to the stage controller 5. The providing of alignment data by the data input/output unit 23 is conducted during the illustrated state, in FIG. 4, of the selector switch 25, and the exposure with image composing in the step-and-repeat method is conducted during the shifted state of said selector switch 25.

Among the alignment systems shown in FIG. 4, the wafer alignment systems 14, 16 are preferably based on a principle of illuminating an alignment mark on the wafer with a laser beam spot of a size sufficient for covering said alignment mark, and photoelectrically detecting the light scattered or diffracted from step edges of said mark. It is also preferable that said laser beam spot is formed with a wavelength not actinic (or only slightly actinic) to the photoresist on the wafer. In case of the wafer alignment system 16, in which the projection lens PL is not involved, there may be employed light of a wide wavelength distribution not actinic to the photoresist, and the image of the mark can be observed with a television camera.

Also in the TTR alignment system 12 there is preferably employed a method of forming a laser beam spot on the reticle and the wafer, moving said beam spot in a scanning motion crossing an alignment mark and photoelectrically detecting the light scattered or diffracted from each mark. Since this TTR alignment system 12 is designed to directly detect the positional aberration between the reticle mark and the wafer mark, the mark position alone on the wafer can be known by placing the wafer mark in the detectable range of the TTR alignment system 12 with respect to the reticle mark, detecting the wafer position by the interferometer 4, and determining the relative aberration between the reticle mark and the wafer mark.

In the following there will be explained the method of exposure with the apparatus shown in FIG. 4. In the present embodiment it is assumed that a chip area is obtained by superimposed exposures of two different patterns by image composing. Consequently the reticles $R_1$, $R_2$ shown in FIG. 2 alone are employed.

Figure 5:
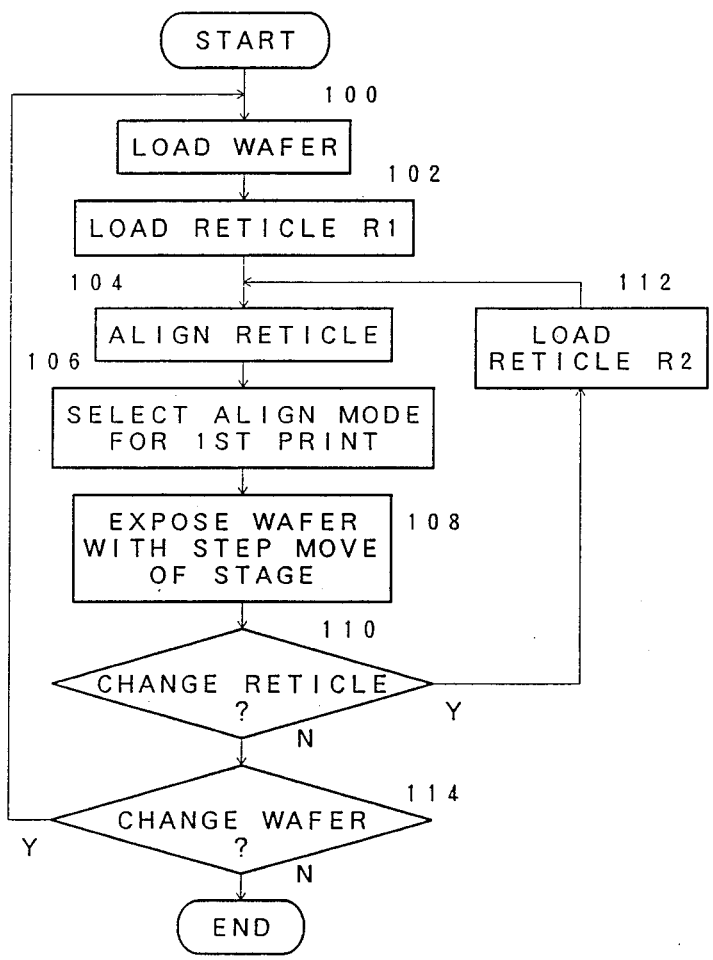
FIG. 5 is a flow chart showing the sequence of first prints.

FIG. 5 shows the control sequence of the first prints (exposure of a first layer) on the wafer in a first embodiment. The arrangement of the circuit pattern and the alignment marks on the reticle $R_1$ or $R_2$ is not illustrated but can be considered similar to the arrangement of the pattern and the marks to be formed on the wafer to be explained later. However, the reticle alignment marks to be detected by the reticle alignment system 10 are preferably provided in positions common to all the reticles. In the following there will be explained the steps shown in FIG. 5.

At first, a wafer coated with photoresist is placed on the wafer stage 2, with a predetermined (mechanical) accuracy of prealignment (step 100). Then, in response to the instruction of the sequence controller 20, the automatic loader 1 loads the reticle $R_1$ (with pattern $A'$) on the reticle stage RS (step 102). Subsequently the reticle alignment system 10 aligns the reticle $R_1$ precisely with respect to a reference position of the apparatus, for example the optical axis AX (step 104). Said reticle alignment includes not only the two-dimensional positioning (x, y) but also the correction of reticle rotation. The alignment in x and y directions of the wafer stage 2 without reticle rotation can be achieved by a method disclosed for example in U.S. Pat. No. 4,385,838.

Figure 6:
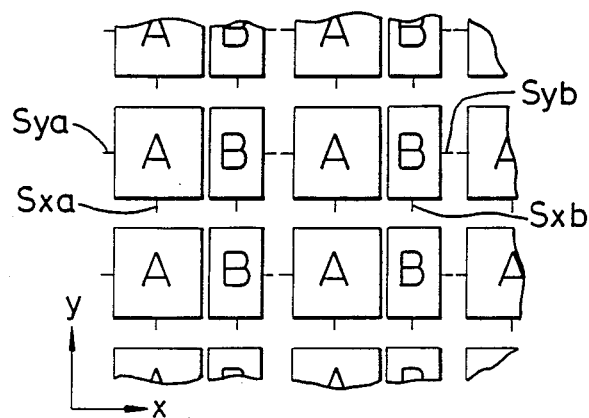
FIG. 6 is a plan view showing the arrangement of patterns formed on the wafer by the first prints.

Then in response to an instruction from the sequence controller 20, the fact that the wafer exposure with the reticle $R_1$ corresponds to the first print of the pattern $A'$ is stored in the mode selector 21, which thus causes the data processing unit 24 to provide the shot positions of the wafer stage 2 for transferring the pattern $A'$ over the entire surface of the wafer according to the arrangement map (step 106). At the same time the selector switch 25 is shifted from the position illustrated in FIG. 4, in order to prepare for the exposure operation. Then the stage controller 5 receives the shot positions in succession from the data processing unit 24 and moves the wafer stage 2 in the step and repeat method, transferring the pattern $A'$ of the reticle $R_1$ in successive exposures onto the wafer (step 108). In this manner, as shown in FIG. 6, the areas A alone of the chip areas are exposed in a matrix arrangement. In the present embodiment, the reticle $R_1$ is provided with mark patterns so as to form an alignment mark $S_{ya}$ for y-direction and an alignment mark $S_{xa}$ for x-direction respectively on x-and y-scribe lines perpendicularly in contact with the area A. After the completion of transfer of the pattern $A'$ to a wafer, there is discriminated whether the reticle is to be replaced (step 110). In the present example, in which the next exposure is effected with the pattern $B'$ of a next reticle $R_2$, the reticle $R_1$ is unloaded and the reticle $R_2$ is loaded (step 112). Then the wafer is exposed to the pattern $B'$ in a similar step-and-repeat method. However, for the second reticle, the mode selection in the step 106 sets the first print for the pattern $B'$, and the design shot positions for the pattern $B'$ are offset, by a certain pitch, from the design shot positions of the pattern $A'$. In the present embodiment, the second reticle $R_2$ also is provided with mark patterns so as to form an alignment mark $S_{yb}$ for y direction and an alignment mark $S_{xb}$ for x direction, respectively on x- and y-scribe lines which are perpendicularly in contact with the area B.

After the transfer of the pattern $B'$ onto the entire surface of the wafer, the areas B of the chip areas are formed, as shown in FIG. 6, with a predetermined relationship to the previously transferred areas A (with a positional error ensuring the jointing accuracy in case the image composing is conducted in the first layer).

Then a step 110 discriminates whether the reticle replacement is necessary. Since two reticles have been used in this case, the sequence proceeds to a step 114 for discriminating whether the exposure operation is to be conducted on a new wafer. If a new wafer is to be exposed, the steps 100 to 110 are repeated as explained above.

Figure 7:
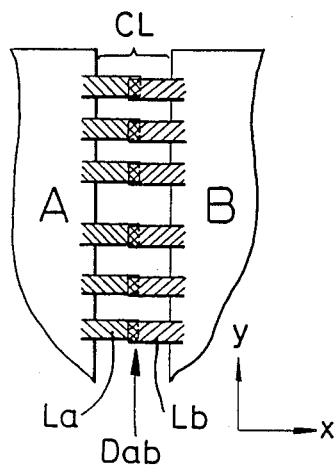
FIG. 7 is a plan view showing an example of jointing.

In this manner the chip areas (areas A, B) are formed by the first print on the wafer. If image composing is conducted from this first layer, the joint portion CL of said areas A, B is formed for example as shown in FIG. 7. A line pattern La connected to the circuit pattern in the area A and a line pattern Lb connected to the circuit pattern in the area B are so formed by exposure that they are precisely aligned in the y-direction and generate small overlapping portion $D_{ab}$ in the x-direction. The line patterns La and Lb are respectively formed on the reticles $R_1$ and $R_2$.

In the following there will be explained a sequence of exposure of a second or any subsequent layer (hereinafter collectively called second print) onto the wafer already subjected to the first print.

In such second print, it is necessary not only to precisely align a new circuit pattern to the area A or B on the wafer but also to pay attention to the mutual relationship, or the jointing accuracy, of a new shot on the area A and a new shot on the area B, because a joint portion CL as shown in FIG. 7 is often formed in some of the second print layers.

The E. G. A. method for the second print may be applied in two ways, either giving emphasis to the matching accuracy of new patterns respectively to the divided areas A, B is each chip area, or giving emphasis to the joint accuracy between the new patterns to be printed respectively on the areas A, B. In the following it is assumed that a reticle $R_1'$ with a pattern $A''$ is used for the second print of the area A, and a reticle $R_2'$ with a pattern B" is used for the second print of the area B.

In the application of the E. G. A. method it is important, according to one of two approaches explained above, to select the shots for the sample alignment (mark detection) on the wafer and to suitably determine the sequence for the replacement of the reticles $R_1'$, $R_2'$ and of the wafers.

Figure 8A:
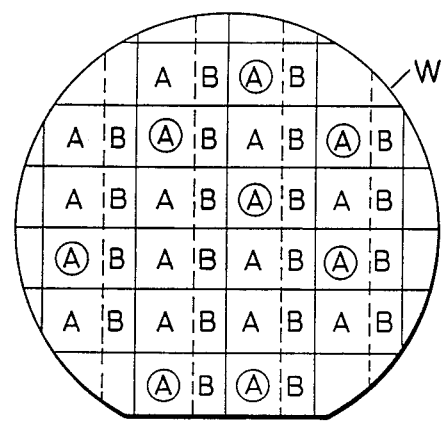
FIGS. 8A, 8B and 8C are plan views of a wafer on which sample shots are marked.
Figure 8B:
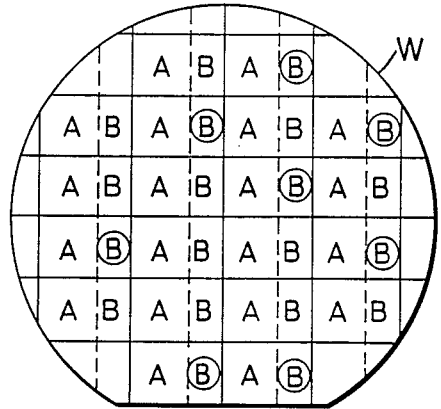
Figure 8C:
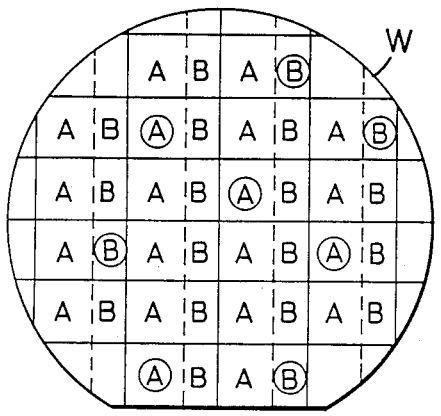

FIGS. 8A, 8B and 8C show different shot selections in the sample alignment of the E. G. A. method. In the present embodiment eight chip areas (areas A, B) are selected, and the position of the alignment mark is determined by sample alignment in the x and y directions in each of said chip areas.

FIG. 8A shows a case of sample alignment on the marks $S_{xa}$, $S_{ya}$ associated with the areas A only of predetermined eight chip areas indicated by circles.

FIG. 8B shows a case of sample alignment on the marks $S_{xb}$, $S_{yb}$ associated with the areas B only of predetermined eight chip areas indicated by circles.

FIG. 8C shows a case of sample alignment on the marks $S_{xa}$, $S_{ya}$, $S_{xb}$, $S_{yb}$ associated with the areas A, B, mixed in a suitable ratio, of eight chip areas. In the illustrated example there are selected four areas A and four areas B indicated by circles.

When emphasis is given to matching accuracy, the conventional E. G. A. method is adopted by selecting the sample shot arrangement shown in FIG. 8A in the exposures with the reticle $R_1'$ with the pattern A", and the sample shot arrangement shown in FIG. 8B in the exposures with the reticle $R_2'$ with the pattern B". In such case the matching accuracy between the area A and the projected image of the pattern A", and that between the area B and the projected image of the pattern B" can be expected to become optimum. However the jointing accuracy of the images of the patterns A" and B" cannot be expected to become better, as it directly reflects the error in the arrangement of the areas A and B in the first print.

On the other hand, when emphasis is given to jointing accuracy, the sample shot arrangement shown in FIG. 8A is selected both for the exposures of the pattern A" in the areas A and for the exposures of the pattern B" in the areas B. In case the exposures of the patterns A", B" are effected in succession by the reticle replacement from $R_1'$ to $R_2'$ while the wafer is maintained on the stage 2, the exposures of the pattern B" may be conducted, without the sample alignment, utilizing the result of the sample alignment for the pattern A". In this case, however, the reticles $R_1'$ and $R_2'$ have to be aligned to the apparatus with a considerably high accuracy at the reticle replacement.

The above-explained method does not degrade the matching accuracy of the area A with the image of the pattern A", but cannot ensure the matching accuracy of the area B with the image of the pattern B". However the jointing accuracy of the images of the patterns A", B" can be optimized.

Finally, in case emphasis is given to both matching accuracy and jointing accuracy, the sample shot arrangement shown in FIG. 8C is selected for the transfer of the pattern A" and B". In case the patterns A", B" are exposed in succession while the wafer is maintained on the stage 2, the exposures of the pattern B" may be conducted, without the sample alignment, utilizing the result of the sample alignment for the pattern A".

Thus, when both accuracy factors are equally considered, deterioration in the matching accuracy between the area A and the image of the pattern A" and that between the area B and the image of the pattern B" is moderate, and the jointing accuracy is maintained at a satisfactory level.

The sample shot arrangements shown in FIGS. 8A, 8B and 8C respectively correspond to three alignment modes selected by the mode selector 21.

Figure 9:
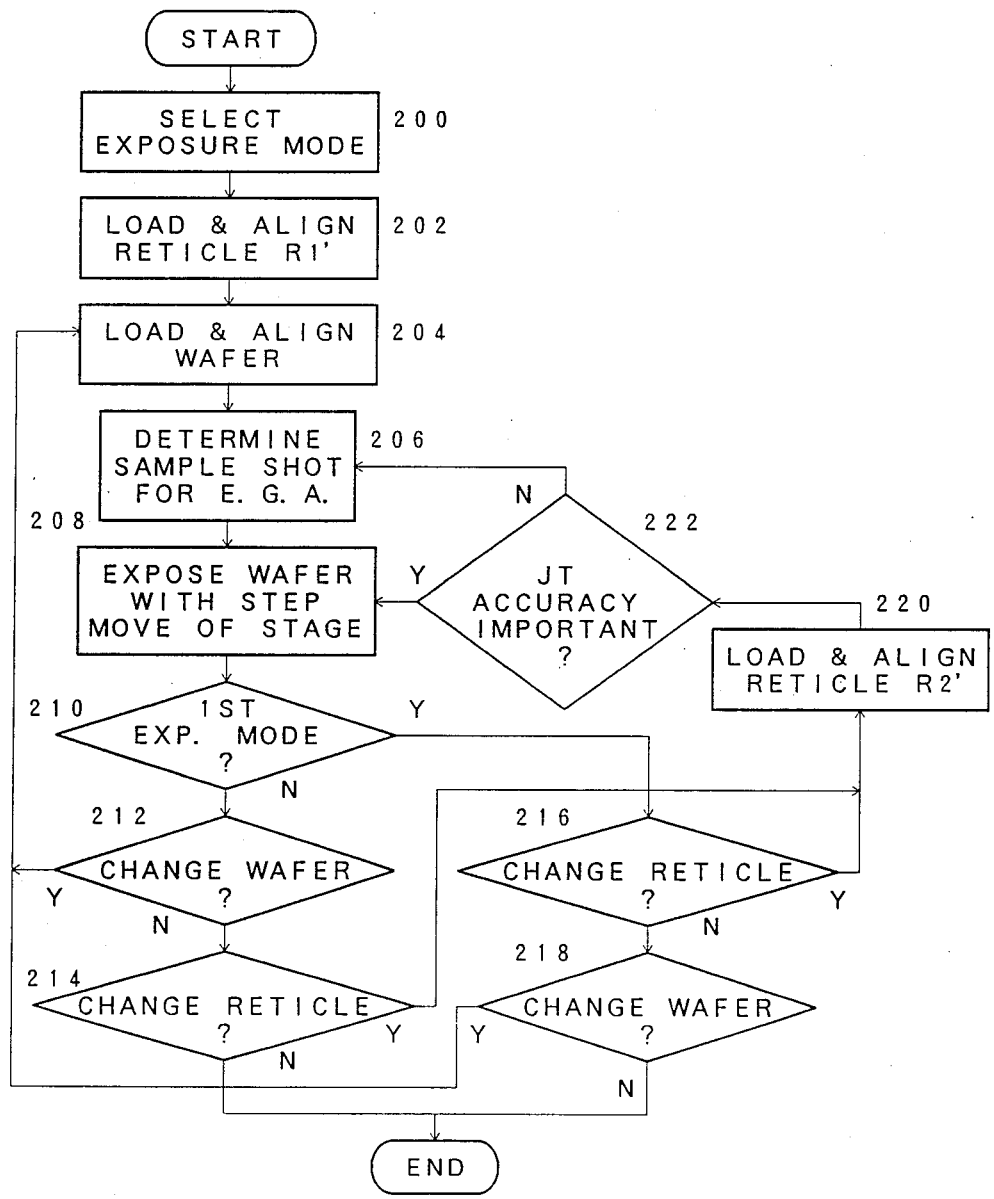
FIG. 9 is a flow chart showing the sequence of second prints.

Now reference is made to FIG. 9 for explaining the second print sequence involving image composing with the E. G. A. method, according to the selection of the sample shot arrangement. In the following description, a mode of exposures with replacements of reticles while a wafer is maintained on the stage 2 is called the first exposure mode, while a mode of exposures with replacements of wafers while a reticle is maintained is called the second exposure mode.

In the first exposure mode, the exposure for each chip area, involving image composing, of the wafer is completed by a cycle of the reticles ($R_1'$, $R_2'$) to be replaced. In the second exposure mode, the exposure is completed by processing the wafers of a lot (for example 25 wafers) with the reticle $R_1'$ and then processing the same wafers with the next reticle $R_2'$.

At first the exposure mode is selected by the mode selector 21 shown in FIG. 4 (step 200). Then reticle $R_1'$ with the pattern A" is loaded and is precisely aligned, by the reticle alignment system 10, with respect to a reference position of the apparatus (step 202).

Then a wafer W, coated with photoresist, is placed on the wafer stage 2 with a predetermined pre-alignment accuracy, and is aligned to a certain accuracy (for example ±1 μm) with the off-axis wafer alignment system 16 (step 204). Thus the shot position of the wafer W is defined, with an error of about ±1 μm, with the resolving power (for example 0.01 μm) of the interferometer 4 in the x-y coordinate system thereof.

Subsequently the sample shots are selected as shown in FIG. 8A, 8B or 8C according to whether the emphasis is to be given to matching accuracy, jointing accuracy or both, and the measurement of mark positions for the E. G. A. method is conducted with the TTR alignment system 12 or the TTL wafer alignment system 14 (step 206).

In the following the outline of E. G. A. method will be explained. The actual position (Xr, Yr) of a shot with respect to the design coordinate values (Xp, Yp) is defined by the following mapping relationship (1):

$$\begin{pmatrix} Xr \\ Yr \end{pmatrix} = \begin{pmatrix} A & B \\ C & D \end{pmatrix} \begin{pmatrix} Xp \\ Yp \end{pmatrix} + \begin{pmatrix} E \\ F \end{pmatrix} \quad (1)$$

$A = R_x \cdot \cos\theta \simeq R_x$ $B = -R_x(\cos\theta \cdot \tan\omega + \sin\theta) \simeq -R_x(\omega + \theta)$ $C = R_y \cdot \sin\theta \simeq R_y \cdot \theta$ $D = R_y(-\sin\theta \cdot \tan\omega + \cos\theta) \simeq R_y$ $E = O_x$ $F = O_y$ wherein $R_x$, $R_y$ are elongation or contraction of the wafer in the x- and y-directions; $\theta$ is the rotation of the coordinate of shot arrangement in the wafer with respect to the x-y coordinate system; $\omega$ is the perpendicularity of the shot arrangement; and $\overline{O}_x$, $\overline{O}_y$ are parallel shifts of the wafer in the x- and y- directions. However, on the actual wafer, the equation (1) has an additional error term $(\alpha, \beta)$ and is represented as follows:

$$\begin{pmatrix} X_{ri} \\ Y_{ri} \end{pmatrix} = \begin{pmatrix} A & B \\ C & D \end{pmatrix} \begin{pmatrix} X_{pi} \\ Y_{pi} \end{pmatrix} + \begin{pmatrix} E \\ F \end{pmatrix} + \begin{pmatrix} \alpha_i \\ \beta_i \end{pmatrix} \quad (2)$$

wherein suffix i indicates the shot number or position. The determining of the variables A, B, C, D, E and F so as to minimize the sum of squares of said error term $\Sigma(\alpha_i^2 + \beta_i^2)$ realizes optimum matching accuracy in each shot on the wafer, by stepping the wafer to the shot positions $(S_r, Y_r)$ calculated according to the equation (1).

Therefore, in order to determine the variables A, B, C, D, E and F, the sample alignment or the mark measurement has to be conducted, mathematically, on six marks, consisting of x-marks and y-marks associated with at least three shot areas. Such process is detailedly disclosed in the aforementioned U.S. Pat. No. 4,780,617 and will not, therefore, be explained further.

Among these values, the perpendicularly $\omega$ and the wafer elongation $R_x$, $R_y$ may be fixed as constants regardless of the result of actual measurement, because these values are almost the same among plural wafers subjected to the same process, and can be made very small (ppm order). The accuracies improve significantly by the effect of averaging when the number of sample shots is increased from 3 to 8 or 9, and gradually beyond 10 sample shots.

The sample alignment (mark position detection) for the E. G. A. method is conducted on at least three, or all, of 8 chip areas shown in FIGS. 8A, 8B and 8C. Then the data processing unit 24 determines the variables A, B, C, D, E, and F and calculates the actual shot positions $(X_{ri}, Y_{ri})$ from the equation (1), based on the design shot positions $(X_{pi}, Y_{pi})$ read from the memory 22.

Based on the shot positions of the pattern A" for the areas A, exposures are conducted by aligning the pattern A" with each area A on the wafer by the step-and-repeat method (step 208).

After the exposures of the pattern A" for a wafer, there is discriminated whether the first or second exposure mode is selected (step 210). In case of the first mode, there is discriminated whether the reticle $R_1'$ is to be replaced by $R_2'$ with the pattern B" (step 216), and, in case of reticle replacement, the reticle $R_2'$ is loaded and aligned (step 220). Then there is discriminated whether emphasis is given to jointing accuracy (or matching accuracy and jointing accuracy) (step 222).

If the step 222 identifies that emphasis is given to jointing accuracy (or jointing and matching accuracies), the shot positions for the pattern B" are determined from the shot positions determined by the E. G. A. method, prior to the exposures of the pattern A", and the exposures are carried out with the step-and-repeat method (step 208). The shot positions of the pattern B" are displaced, from those of the pattern A" determined by the E. G. A. method, by the design distance between the centers of the patterns A" and B" in the x-direction.

On the other hand, if the step 222 identifies that emphasis is given to matching accuracy, the sample alignment for the E. G. A. method is conducted again on the marks $S_{xb}$, $S_{yb}$ associated with the areas B of the sample shots as shown in FIG. 8B (step 206). Thus the arrangement of the areas B on the wafer is specified with a high accuracy according to the equation (1), and the exposures are conducted with the step-and-repeat method (step 208).

The exposures of the patterns A" and B" having been completed at the step 216, a step 218 discriminates whether a next wafer is to be exposed. If it is to be exposed, the current wafer is unloaded, and the sequence returns to the step 204 to execute the exposure operation for the next wafer. If the step 218 identifies that the next wafer need not be exposed, the exposure sequence is terminated.

On the other hand if the step 210 identifies the second exposure mode, a step 212 discriminates whether the wafer is to be replaced, and, if wafer replacement is required, the sequence returns to the step 204 to repeat the foregoing sequence on the next wafer. On the other hand, if the step 212 identifies that wafer replacement is not required, for example when the exposures of the pattern A" are completed for the last wafer in a lot, a step 214 discriminates whether the current reticle is replaced by the next reticle $R_2'$. If the reticle is to be replaced, the sequence proceeds to a step 220 while the wafer W is fixed on the, stage 2, and the subsequent sequence is essentially the same as in the first mode. In case the reticle $R_2'$ has been used for the exposures, there is no additional reticle present at the step 214, so that the exposure sequence is terminated.

In the present embodiment, the marks to be measured in the sample alignment of the E. G. A. method are arbitrarily selected from the areas A or B according to whether emphasis is given to matching accuracy or jointing accuracy, but the eight chip areas in which the areas A are designated as shown in FIG. 8A need not be the same as those in which the areas B are designated as shown in FIG. 8B. More specifically, when the areas A or B alone are selected for sample alignment for optimizing matching accuracy, the arrangement of the chip areas on the wafer in which the areas A are selected can be totally different from or partially overlapping with the arrangement of the chip areas in which the areas B are selected.

Though the present embodiment utilizes two patterns for image composing, the same advantage can naturally be obtained in image composing with three or more patterns. In such image composing with three or more patterns, there is given a larger freedom in the selection and combination of the sample shots for achieving both matching accuracy and jointing accuracy, so that a larger flexibility is obtained in the superimposed exposure.

In the present embodiment, for attaining both matching accuracy and jointing accuracy, the E. G. A. method is conducted by the sample alignment on four areas A and four areas B as shown; in FIG. 8C, as if the areas A and B are printed from the same reticle, but the areas A and B used in the sample alignment may be selected with an arbitrary ratio. When said ratio deviates from 1:1, the balance of matching accuracy and jointing accuracy is changed, and emphasis on matching accuracy becomes stronger for the area A or B. Said ratio can be suitably selected by the operator, according to the desired level of matching accuracy.

In the exposure sequence for the second print of the present embodiment, in case emphasis is given to matching accuracy, the arrangement characteristics M(A) of the areas A only and those M(B) of the area 8 only are independently determined in the sample alignment. However, if the relative relationship of the areas A and B is exactly as original designed, the arrangement characteristics M(A) and M(B) should be essentially the same in the first exposure mode in which the reticles are changed while the wafer is not changed. Stated differently the variables A–F in the equation (1) for determining the characteristics M(A) should be practically equal to those for determining the characteristics M(B).

It is also possible, therefore, to know the slight aberration in the relative relationship of the areas A and B, by comparing the variables A–F for the characteristics M(B) with those for the characteristics M(A) determined previously. It is also possible to estimate, to a certain extent, the cause of aberration of the areas A and B, by determining the differences in the variables A–F for these two areas. For example, large differences in the variables E, F indicate a difference in the accuracy of the reticle alignment (step 104 in FIG. 5) between the first reticle $R_1$ (pattern A') and the second reticle $R_2$ (pattern B') in transferring said patterns onto the areas A, B. Also in the comparison of the variables A, B, C and D, a small difference in the variable D combined with a large difference in the variable C, for example, is estimated to be caused by an error in the rotational alignment of two reticles $R_1$, $R_2$ between the exposures of the areas A and B, or a slight rotation of the entire wafer stage 2, or a slight change in yawing. Also the perpendicularity $\omega$ of the arrangement can be represented by the variables A, B, C and D based on the aforementioned approximations in the following manner.

The relation $B \sim -R_x(\omega+\theta)$ can be transformed as $\omega = -B/R_x$ into which $R_x \sim A$, $R_y \cdot \theta \sim C$ and $R_y \sim D$ are substituted to obtain:

$$\omega = -\frac{C}{R_y} - \frac{B}{A} = -\left(\frac{C}{D} + \frac{B}{A}\right)$$

Thus, in case of a difference in the perpendicularity $\omega$ between the characteristics M(A) and M(B), it can be estimated that the perpendicularity of the x-y coordinate system defined by the interferometer 4, namely the perpendicularity of the movable mirrors fixed on the wafer stage 2, has changed for some reason between the exposures of the areas A and those of the areas B.

It is therefore possible, by suitably conducting evaluations with the variables A–F or $R_x$, $R_y$, $\theta$, $\omega$ etc. in the course of the exposure sequence, to predict deterioration of the matching accuracy in the chip area on wafer, in a layer to be exposed with the emphasis on jointing accuracy.

In the exposure sequence shown in FIG. 9, in case of exposures with emphasis on matching accuracy, the sample alignment operation is conducted independently for the sample shots shown in FIG. 8A and for those shown in FIG. 8B at separate timings. However, in case of the first exposure mode, it is also possible to effect mark detecting operations on 16 areas A, B of eight chip areas on the wafer only in the beginning and to later select suitable data required for the calculation in the E. G. A. method.

The mark measurements in the E. G. A. method have to not only be reproducible and accurate but also sufficiently quick. For this reason the TTR alignment system 12 or the TTL alignment system 14 can be advantageously utilized as in the present embodiment, but the off-axis wafer alignment system 16 can be used similarly if enough resolving power and accuracy are given. This method results in a base line error resulting from the spatial separation of the projection lens PL and the wafer alignment system 16, and an elongated stroke of the wafer stage 2 required for observing all the chip areas of the wafer with the wafer alignment system 16, but satisfactory detecting accuracy can be expected because there are few limitations in improving the accuracy of mark detection, as the wafer surface is observed independently from the projection lens PL.

In case the TTL wafer alignment system 14 or the wafer alignment system 16 is employed for the E. G. A. method, the sequential order of the reticle alignment and the E. G. A. process may be inverted in the sequence shown in FIG. 9. More specifically, the step 202 or 220 may be inserted between the steps 206 and 208 shown in FIG. 9, for obtaining the same effect.

The image composing in the present embodiment is conducted by the E. G. A. method, but it can be similarly conducted in die-by-die or site-by-site alignment in case of a stepper provided with software for selecting emphasis on matching accuracy, on joint accuracy or on both, though throughput is lower.

In the present embodiment, the areas A, B divided in the chip area DC are assumed to have mutually different circuit patterns so that two reticles $R_1'$, $R_2'$ bearing different patterns A", B" are employed, but such assumption is not essential. For example, in a stepper for producing liquid crystal display panels, the same fine patterns are cyclically exposed on a large glass plate coated with photoresist, so that two or more among three or more divided areas may be exposed with the same reticle, if the joint portion is suitably designed.

It is also possible to change the pattern to be transferred to the wafer, as disclosed in U.S. Pat. No. 4,748,478, by forming patterns A", B", C", D" etc. on the same reticle and displacing the reticle stage in accordance with position measurement by the interferometer. In this case the time required for pattern replacement is significantly reduced in comparison with prior technology. It is therefore possible to expose partial areas in a chip area on the wafer in succession to the different patterns on the reticle by moving the reticle stage, then to step the wafer stage 2 to a next chip area and to repeat the exposures in a similar manner.

Though the forgoing embodiments involve a stepper, the present invention is similarly applicable to an X-ray exposure apparatus in of 10–50 $\mu$m and the pattern transfer is conducted with the step-and-repeat method.

I claim:

1. An exposure apparatus comprising:
   stage means capable of two-dimensional movement while supporting a substrate on which plural image receiving areas are substantially regularly formed, the plural image receiving areas each having plural partial areas including a first partial area and a second partial area;
   alignment means having plural alignment modes including selectably first, second and third alignment modes and providing information related to an entire arrangement of the plural image receiving areas formed on the substrate,
   in the first alignment mode said alignment means providing said arrangement information on the basis of a position of the first partial area included in several of said plural receiving areas,
   in the second alignment mode said alignment means providing said arrangement information on the basis of a position of the second partial area included in several of said plural receiving areas; and in the third alignment mode said alignment means providing said arrangement information on the basis of a position of the first partial area in one of at least two areas in said plural receiving areas and on the basis of a position of the second partial area in another of said at least two areas;

mask means having a pattern to be transferred onto at least one of said first and second partial areas; and control means for controlling said stage means in accordance with said arrangement information so that said plural receiving areas may be aligned in succession with the pattern of said mask means.

2. An exposure apparatus according to claim 1, further comprising means for selecting one or more of said first, second and third alignment modes.

3. An exposure apparatus according to claim 1, wherein each of said receiving areas is formed with alignment mark means at each of said first and second partial areas, said alignment means detecting the positions of the first and the second partial areas using the alignment mark means.

4. An exposure apparatus according to claim 1, wherein said alignment means, in the first alignment mode provides said arrangement information on the basis of respective positions of the first partial areas in n receiving areas of said plural receiving areas, in the second alignment mode provides said arrangement information on the basis of respective positions of the second partial areas in said n receiving areas, and in the third alignment mode provides said arrangement information on the basis of respective positions of the first partial areas in m areas of said n receiving areas where m is smaller than n, and respective positions of the second partial areas in (n-m) areas of said n image receiving areas.

5. An exposure apparatus comprising:

stage means capable of two dimensional movement while supporting a substrate formed substantially regularly with plural image receiving areas, each of said image receiving areas having plural partial areas each including first and second partial areas, a first alignment mark means provided appendently to the first partial area and a second alignment mark means provided appendently to the second partial area;

alignment optical means for detecting said first and second alignment mark means;

means for operating said alignment optical means to detect the position of the first partial area in one of at least two areas of said plural receiving areas and the position of the second partial area in another of said at least two areas;

means for providing information relating to an entire arrangement of said plural image receiving areas on the basis of positions detected by said alignment optical means; and means for moving said stage means in accordance with said information.

6. An exposure apparatus according to claim 5, wherein said operating means detects the position of the first partial area with respect to first plural areas of said plural image receiving areas and detects the position of the second partial area with respect to second plural areas which differ from the first plural areas.

7. An exposure apparatus according to claim 6, wherein the number of said first plural areas and the number of said second plural areas are substantially the same.

8. An exposure apparatus according to claim 5, further comprising mask means having a pattern to be transferred onto at least one of said first and second partial areas, and means for controlling said stage means in accordance with said arrangement information so that plural image receiving areas may be aligned in succession with the pattern of the mask means.

* * * * *